(12) United States Patent
Nohara et al.

(10) Patent No.: US 12,494,363 B2
(45) Date of Patent: Dec. 9, 2025

(54) METHOD OF PROCESSING SUBSTRATE, METHOD OF MANUFACTURING SEMICONDUCTOR DEVICE, RECORDING MEDIUM, AND SUBSTRATE PROCESSING APPARATUS

(71) Applicant: Kokusai Electric Corporation, Tokyo (JP)

(72) Inventors: Shingo Nohara, Toyama (JP); Kiyohisa Ishibashi, Toyama (JP); Takafumi Nitta, Toyama (JP); Kimihiko Nakatani, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 426 days.

(21) Appl. No.: 18/087,257

(22) Filed: Dec. 22, 2022

(65) Prior Publication Data
US 2023/0317447 A1   Oct. 5, 2023

(30) Foreign Application Priority Data

Mar. 9, 2022 (JP) ................................ 2022-036043

(51) Int. Cl.
*H01L 21/02* (2006.01)
*C23C 16/34* (2006.01)
*C23C 16/40* (2006.01)

(52) U.S. Cl.
CPC ...... *H01L 21/02211* (2013.01); *C23C 16/345* (2013.01); *C23C 16/401* (2013.01);
(Continued)

(58) Field of Classification Search
None
See application file for complete search history.

(56) References Cited

U.S. PATENT DOCUMENTS

| | | |
|---|---|---|
| 9,865,455 B1 | 1/2018 | Sims et al. |
| 2003/0122204 A1 | 7/2003 | Nomoto et al. |

(Continued)

FOREIGN PATENT DOCUMENTS

| | | |
|---|---|---|
| JP | 2002-203917 A | 7/2002 |
| JP | 2002-217317 A | 8/2002 |

(Continued)

OTHER PUBLICATIONS

Japanese Office Action issued on Oct. 3, 2023 for Japanese Patent Application No. 2022-036043.
(Continued)

*Primary Examiner* — Asok K Sarkar
(74) *Attorney, Agent, or Firm* — Volpe Koenig

(57) ABSTRACT

There is provided a technique including: forming a first film containing first element and second element; and forming a second film adjacent to the first film and containing the first element and the second element being different in characteristics from the first film, wherein one of the first and second films is formed by performing a first cycle a predetermined number of times, the first cycle including performing: (a1) supplying a first precursor gas containing the first element; and (b1) supplying a first reaction gas containing the second element, and wherein the other of the first and second films is formed by performing a second cycle a predetermined number of times, the second cycle including performing: (a2) supplying a second precursor gas containing the first element and being higher in a thermal decomposition temperature than the first precursor gas; and (b2) supplying a second reaction gas containing the second element.

18 Claims, 9 Drawing Sheets

(52) U.S. Cl.
CPC .... *H01L 21/02164* (2013.01); *H01L 21/0217* (2013.01); *H01L 21/02271* (2013.01)

(56) References Cited

U.S. PATENT DOCUMENTS

| | | |
|---|---|---|
| 2003/0222318 A1 | 12/2003 | Tanaka et al. |
| 2004/0251521 A1 | 12/2004 | Tanaka et al. |
| 2004/0259386 A1 | 12/2004 | Tanaka et al. |
| 2007/0215958 A1 | 9/2007 | Tanaka et al. |
| 2010/0190348 A1 | 7/2010 | Akae et al. |
| 2012/0126306 A1 | 5/2012 | Kawaguchi et al. |
| 2013/0084712 A1 | 4/2013 | Yuasa et al. |
| 2016/0079054 A1 | 3/2016 | Chen et al. |
| 2017/0053792 A1 | 2/2017 | Lu et al. |
| 2017/0186604 A1 | 6/2017 | Orihashi et al. |
| 2017/0372886 A1 | 12/2017 | Chen et al. |
| 2018/0068844 A1 | 3/2018 | Chen et al. |
| 2018/0190496 A1 | 7/2018 | Ashihara et al. |
| 2019/0295838 A1 | 9/2019 | Chen et al. |
| 2020/0365392 A1 | 11/2020 | Chen et al. |

FOREIGN PATENT DOCUMENTS

| | | |
|---|---|---|
| JP | 2003-347543 A | 12/2003 |
| JP | 2010-258388 A | 11/2010 |
| JP | 2012-109464 A | 6/2012 |
| JP | 2013-084911 A | 5/2013 |
| JP | 2017-117977 A | 6/2017 |
| KR | 20090102420 A | 9/2009 |
| TW | I716334 B | 1/2021 |
| TW | I753523 B | 1/2022 |
| WO | 2017/037927 A1 | 3/2017 |

OTHER PUBLICATIONS

Taiwan Office Action issued on Jul. 10, 2023 for Taiwan Patent Application No. 111140791.
Extended European Search Report issued on Aug. 3, 2023 for European Patent Application No. 22215311.6.
Singapore Search Report issued on Aug. 28, 2025 for Singapore Patent Application No. 10202260552T.
Singapore Written Opinion issued on Aug. 28, 2025 for Singapore Patent Application No. 10202260552T.

METHOD OF PROCESSING SUBSTRATE, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2022-036043, filed on Mar. 9, 2022, the entire contents of which are incorporated herein by reference.

TECHNICAL FIELD

The present disclosure relates to a method of processing a substrate, a method of manufacturing a semiconductor device, a recording medium, and a substrate processing apparatus.

BACKGROUND

In the related art, in recent years, a NAND memory, which is a nonvolatile memory, is multi-layered to develop a 3D NAND. Each memory cell of the 3D NAND includes a nitride film called a charge trap nitride (CTN) that holds data.

It is desired that charge retention characteristics of the CTN be good. It is also desired that step coverage characteristics of the CTN be good since the CTN is uniformly deposited in narrow and long trenches.

SUMMARY

Some embodiments of the present disclosure provide a technique capable of achieving good charge retention characteristics and good step coverage characteristics.

According to some embodiments of the present disclosure, there is provided a technique, which includes: forming a first film containing a first element and a second element; and forming a second film which is adjacent to the first film and contains the first element and the second element, the second film being different in characteristics from the first film, wherein one of the first film and the second film is formed by performing a first cycle a predetermined number of times, the first cycle including performing: (a1) supplying a first precursor gas containing the first element; and (b1) supplying a first reaction gas containing the second element, and wherein the other of the first film and the second film is formed by performing a second cycle a predetermined number of times, the second cycle including performing: (a2) supplying a second precursor gas containing the first element and being higher in a thermal decomposition temperature than the first precursor gas; and (b2) supplying a second reaction gas containing the second element.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of the Present Disclosure

Embodiments of the present disclosure will be now described with reference to FIGS. 1 to 6. The drawings used in the following description are schematic, and dimensional relationships, ratios, and the like of various components shown in figures may not match actual ones. Further, dimensional relationships, ratios, and the like of various components among plural figures may not match one another.

(1) Structure of Substrate Processing Apparatus

Figure 1:
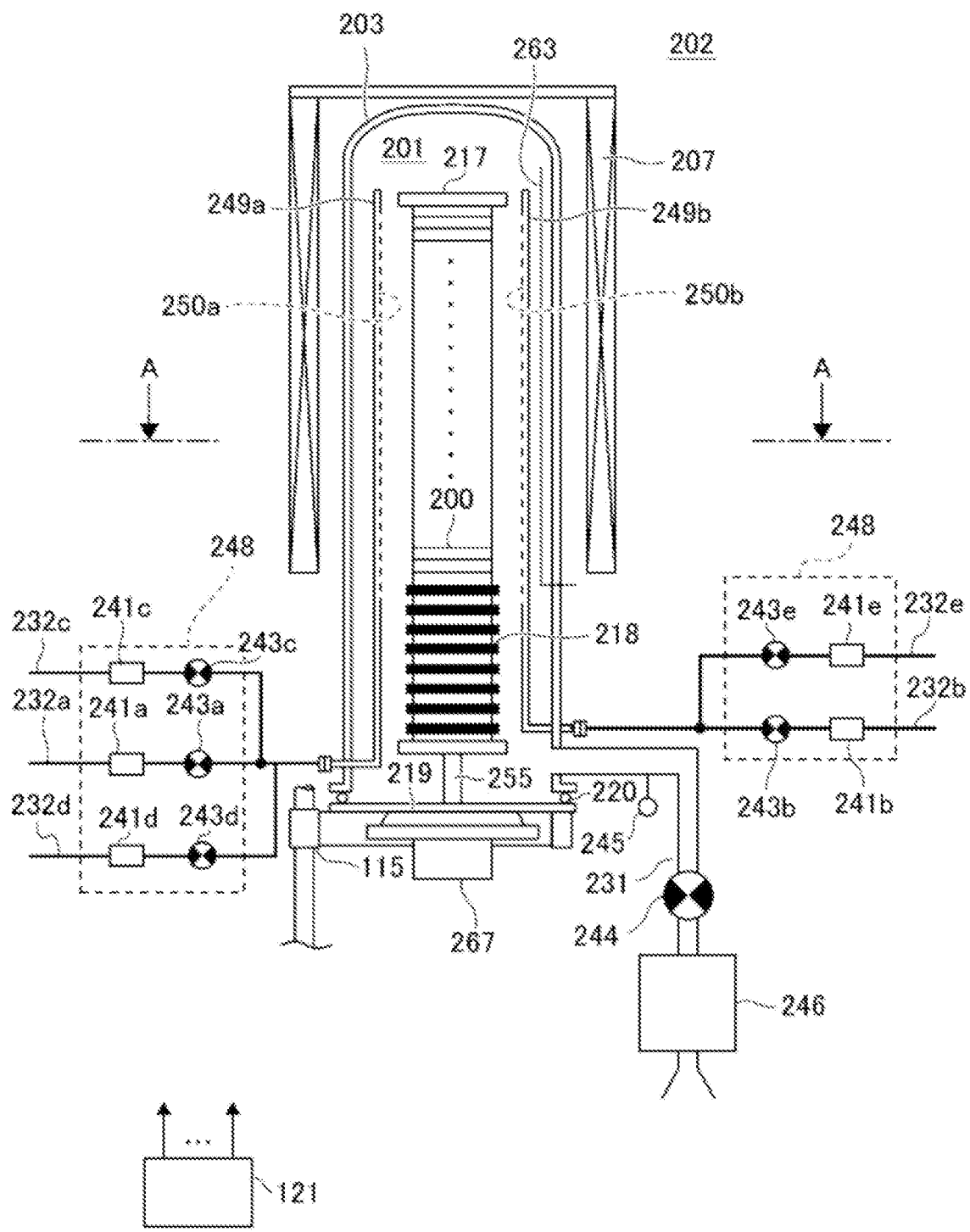
FIG. 1 shows a schematic structure of a vertical process furnace of a substrate processing apparatus suitably used in embodiments of the present disclosure, in which a portion of the process furnace is shown in a vertical cross section.

As shown in FIG. 1, a process furnace 202 includes a heater 207 as a heating mechanism (a temperature regulator). The heater 207 is formed in a cylindrical shape and is supported by a support plate to be vertically installed. The heater 207 also functions as an activator (an exciter) configured to thermally activate (excite) a gas.

A reaction tube 203 is disposed inside the heater 207 to be concentric with the heater 207. The reaction tube 203 is made of, for example, heat resistant material such as quartz ($SiO_2$) or silicon carbide (SiC), and is formed in a cylindrical shape with its upper end closed and its lower end opened. A process chamber 201 is formed in a hollow cylindrical area of the reaction tube 203. The process chamber 201 is configured to accommodate a plurality of wafers 200 as substrates. The wafers 200 are processed in the process chamber 201.

Nozzles 249a and 249b are installed in the process chamber 201 to penetrate through a lower sidewall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed at the gas supply pipes 232a and 232b, respectively, sequentially from the upstream side of gas flow. A gas supply pipe 232c is connected to the gas supply pipe 232a at the downstream side of the valve 243a. A MFC 241c and a valve 243c are installed at the gas supply pipe 232c sequentially from the upstream side of gas flow. Gas supply pipes 232d and 232e are connected to the gas supply pipes 232a and 232b at the downstream side of the valves 243a and 243b, respectively. MFCs 241d and 241e and valves 243d and 243e are installed at the gas supply pipes 232d and 232e, respectively, sequentially from the upstream side of gas flow.

Figure 2:
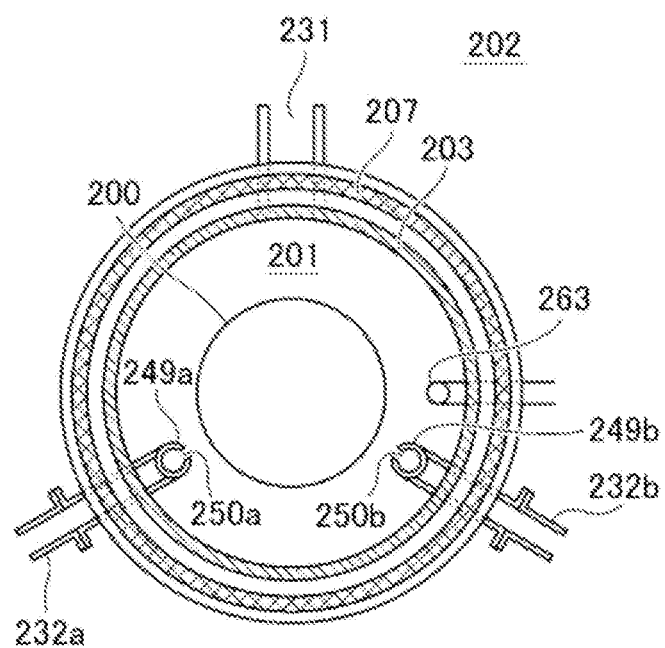
FIG. 2 shows a schematic structure of the vertical process furnace of the substrate processing apparatus suitably used in the embodiments of the present disclosure, in which a portion of the process furnace is shown in a cross section taken along line A-A in FIG. 1.

As shown in FIG. 2, each of the nozzles 249a and 249b is disposed in an annular space in a plane view between an inner wall of the reaction tube 203 and the wafers 200 so as to extend upward from a lower side to an upper side of the inner wall of the reaction tube 203, that is, along an arrangement direction of the wafers 200. Specifically, each of the nozzles 249a and 249b is installed in a region horizontally surrounding a wafer arrangement region in which the wafers 200 are arranged at a lateral side of the wafer arrangement region, along the wafer arrangement region. Gas supply holes 250a and 250b configured to supply a gas are formed on side surfaces of the nozzles 249a and 249b, respectively. Each of the gas supply holes 250a and 250b is opened to face the center of the reaction tube 203, which enables a gas to be supplied toward the wafers 200. A plurality of gas supply holes 250a and 250b are formed from the lower side to the upper side of the reaction tube 203.

A first precursor gas containing a first element is supplied from the gas supply pipe 232a into the process chamber 201 via the MFC 241a, the valve 243a, and the nozzle 249a.

A second precursor gas containing the first element and being higher in a thermal decomposition temperature than the first precursor gas is supplied from the gas supply pipe 232c into the process chamber 201 via the MFC 241c, the valve 243c, and the nozzle 249a.

That is, different precursor gases are used as the first precursor gas and the second precursor gas.

A reaction gas containing a second element different from the first element is supplied from the gas supply pipe 232b into the process chamber 201 via the MFC 241b, the valve 243b, and the nozzle 249b. The reaction gas is a substance containing a molecular structure (chemical structure) different from that of the precursor gas.

An inert gas, for example, a nitrogen ($N_2$) gas, is supplied from the gas supply pipes 232d and 232e into the process chamber 201 via the MFCs 241d and 241e, the valves 243d and 243e, the gas supply pipes 232a and 232b, and the nozzles 249a and 249b, respectively. The $N_2$ gas acts as a purge gas, a carrier gas, a dilution gas, or the like.

When the gases as mentioned above flow from the gas supply pipes, respectively, a first precursor gas supply system mainly includes the gas supply pipe 232a, the MFC 241a, and the valve 243a. A second precursor gas supply system mainly includes the gas supply pipe 232c, the MFC 241c, and the valve 243c. A reaction gas supply system mainly includes the gas supply pipe 232b, the MFC 241b, and the valve 243b. An inert gas supply system mainly includes the gas supply pipes 232d and 232e, the MFCs 241d and 241e, and the valves 243d and 243e.

One or the entirety of the above-described various supply systems may be constituted as an integrated supply system 248 in which the valves 243a to 243e, the MFCs 241a to 241e, and so on are integrated. The integrated supply system 248 is connected to each of the gas supply pipes 232a to 232e. Thus, the integrated supply system 248 is configured such that operations of supplying various gases into the gas supply pipes 232a to 232e, that is, an opening/closing operation of the valves 243a to 243e, a flow rate regulation operation by the MFCs 241a to 241e, and the like are controlled by a controller 121 described below. The integrated supply system 248 is constituted as an integral type or division type integrated unit, and may be attached to or detached from the gas supply pipes 232a to 232e and the like on an integrated unit basis, such that maintenance, replacement, extension, and the like of the integrated supply system 248 may be performed on an integrated unit basis.

An exhaust pipe 231 configured to exhaust an internal atmosphere of the process chamber 201 is connected to the lower side of the sidewall of the reaction tube 203. The exhaust pipe 231 is made of, for example, metal material such as SUS. A vacuum pump 246 as a vacuum exhauster, is connected to the exhaust pipe 231 via a pressure sensor 245, which is a pressure detector (pressure detection part) configured to detect an internal pressure of the process chamber 201, and an auto pressure controller (APC) valve 244, which is a pressure regulator (pressure regulation part). The APC valve 244 is configured to perform or stop a vacuum exhausting operation in the process chamber 201 by opening/closing the valve while the vacuum pump 246 is actuated, and is also configured to regulate the internal pressure of the process chamber 201 by adjusting an opening state of the valve based on pressure information detected by the pressure sensor 245 while the vacuum pump 246 is actuated. An exhaust system mainly includes the exhaust pipe 231, the pressure sensor 245, and the APC valve 244. The exhaust system may include the vacuum pump 246.

A seal cap 219, which serves as a furnace opening lid configured to be capable of hermetically sealing a lower end opening of the reaction tube 203, is installed under the reaction tube 203. The seal cap 219 is made of, for example, metal material such as SUS, and is formed in a disc shape. An O-ring 220, which is a seal making contact with the lower end of the reaction tube 203, is installed on an upper surface of the seal cap 219. A rotation mechanism 267 configured to rotate a boat 217, which is described below, is installed under the seal cap 219. A rotary shaft 255 of the rotation mechanism 267 is made of, for example, metal material such as SUS, and is connected to the boat 217 through the seal cap 219. The rotation mechanism 267 is configured to rotate the wafers 200 by rotating the boat 217. The seal cap 219 is configured to be vertically moved up or down by a boat elevator 115 which is an elevator installed outside the reaction tube 203. The boat elevator 115 is constituted as a transfer (transfer mechanism) which loads/unloads (transfers) the wafers 200 into/out of the process chamber 201 by moving the seal cap 219 up or down.

The boat 217 serving as a substrate support is configured to support a plurality of wafers 200, for example, 25 to 200 wafers, in such a state that the wafers 200 are arranged in a horizontal posture and in multiple stages along a vertical direction with centers of the wafers 200 aligned with one another. As such, the boat 217 is configured to arrange the wafers 200 to be spaced apart from each other. The boat 217 is made of, for example, heat resistant material such as quartz or SiC. Heat insulating plates 218 made of, for example, heat resistant material such as quartz or SiC are installed at the lower side of the boat 217 in multiple stages.

A temperature sensor 263 serving as a temperature detector is installed in the reaction tube 203. Based on temperature information detected by the temperature sensor 263, a state of supplying electric power to the heater 207 is regulated such that a temperature distribution in the process chamber 201 becomes a desired temperature distribution. The temperature sensor 263 is installed along the inner wall of the reaction tube 203.

Figure 3:
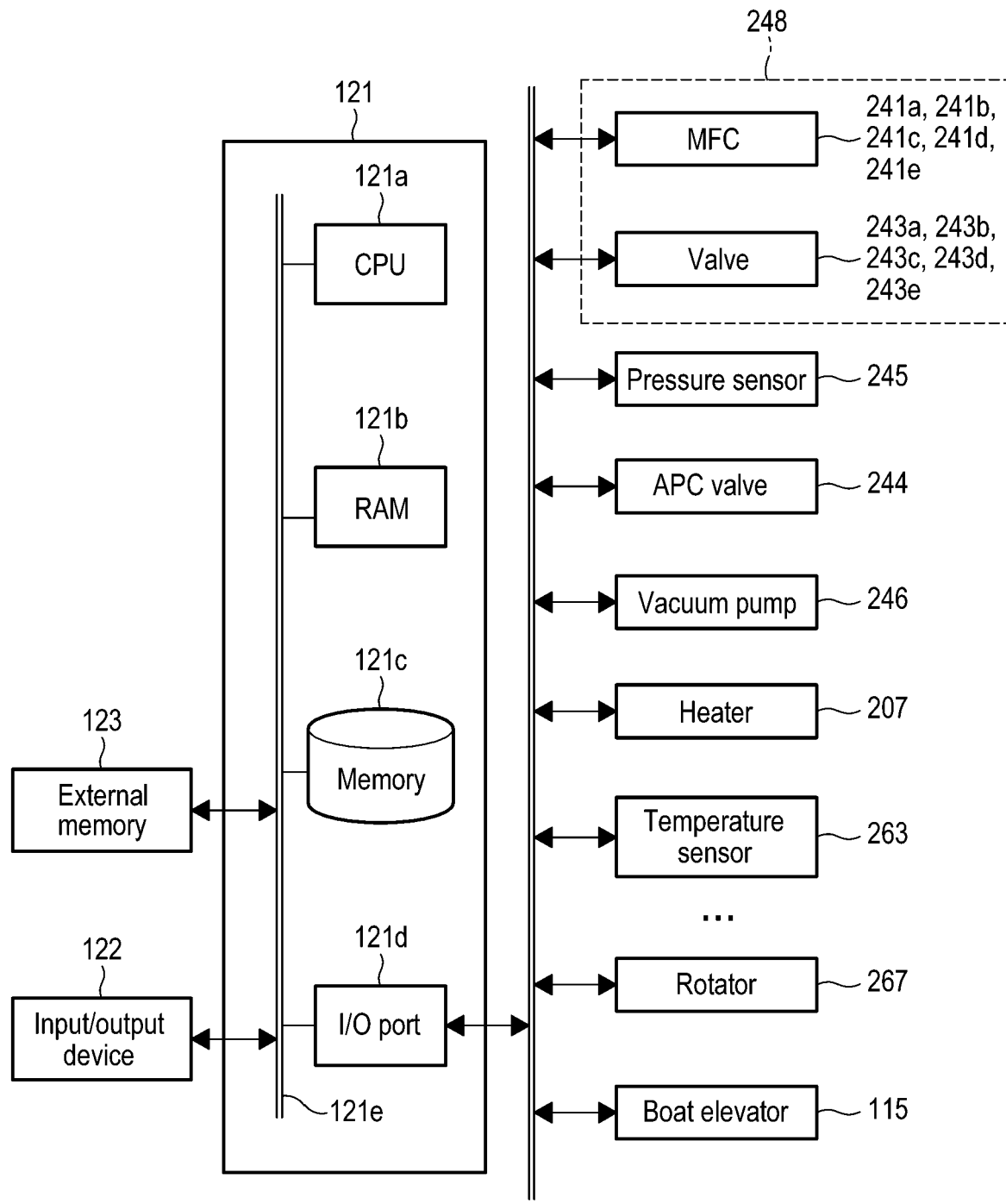
FIG. 3 shows a schematic structure of a controller of the substrate processing apparatus suitably used in the embodiments of the present disclosure, in which a control system of the controller is shown in a block diagram.

As shown in FIG. 3, a controller 121, which is a control part (control means or unit), may be constituted as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 formed of, e.g., a touch panel or the like, is connected to the controller 121.

The memory 121c includes, for example, a flash memory, a hard disk drive (HDD), or the like. A control program that controls operations of a substrate processing apparatus, a process recipe in which sequences and conditions of a film-forming process to be described below are written, etc. are readably stored in the memory 121c. The process recipe functions as a program that causes the controller 121 to execute each sequence in the film-forming process, which is be described below, to obtain an expected result. Hereinafter, the process recipe and the control program may be generally and simply referred to as a "program." Further, the process recipe may be simply referred to as a "recipe." When the term "program" is used herein, it may indicate a case of including the recipe, a case of including the control program, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotator 267, the boat elevator 115, and so on.

The CPU 121a is configured to read and execute the control program from the memory 121c. The CPU 121a is also configured to be capable of reading the recipe from the memory 121c according to an input of an operation command from the input/output device 122. The CPU 121a is configured to be capable of controlling the flow rate regulation operation of various kinds of gases by the MFCs 241a to 241e, the opening/closing operation of the valves 243a to 243e, the opening/closing operation of the APC valve 244, the pressure regulation operation performed by the APC valve 244 based on the pressure sensor 245, the actuating and stopping operation of the vacuum pump 246, the temperature regulation operation performed by the heater 207 based on the temperature sensor 263, the operation of rotating the boat 217 with the rotator 267 and adjusting the rotation speed of the boat 217, the operation of moving the boat 217 up or down by the boat elevator 115, and so on, according to contents of the read recipe.

The controller 121 may be constituted by installing, on the computer, the aforementioned program stored in the external memory 123. Examples of the external memory 123 may include a magnetic disk such as a HDD, an optical disc such as a CD, a magneto-optical disc such as a MO, a semiconductor memory such as a USB memory, and the like. The memory 121c or the external memory 123 is constituted as a computer-readable recording medium. Hereinafter, the memory 121c and the external memory 123 may be generally and simply referred to as a "recording medium." When the term "recording medium" is used herein, it may indicate a case of including the memory 121c, a case of including the external memory 123, or a case of including both the memory 121c and the external memory 123. Furthermore, the program may be provided to the computer by using communication means or unit such as the Internet or a dedicated line, instead of using the external memory 123.

Figure 4:
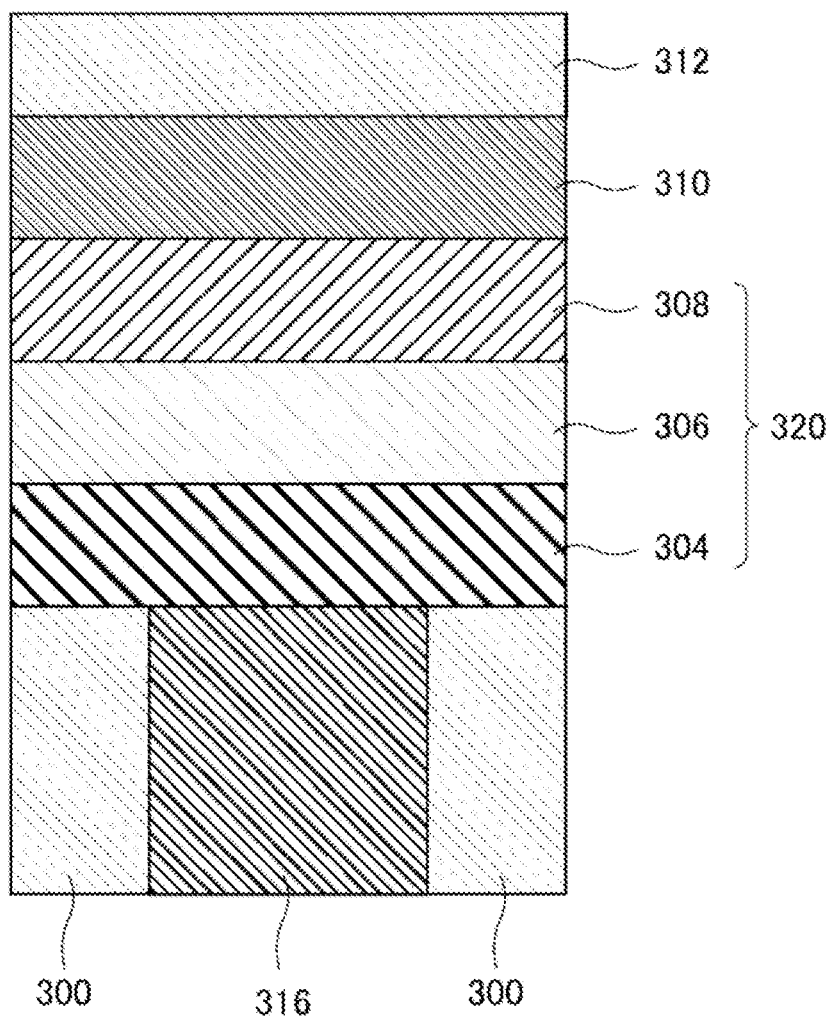
FIG. 4 is a view showing an example of a cross-sectional structure of a 3D NAND memory cell.

FIG. 4 is a view showing an example of a cross-sectional structure of a 3D NAND memory cell on which a substrate processing process of the present disclosure is performed. FIGS. 5A to 5I are views showing an example of a process of manufacturing the 3D NAND memory cell shown in FIG. 4.

In the 3D NAND memory cell, first, silicon oxide films (SiO films) 300 and silicon nitride films (SiN films) 302 are alternately laminated on a wafer 200. Then, the alternately laminated films are etched in a concave shape from top to bottom to form a concave portion 303 such as a trench or a hole (see FIG. 5A).

Next, a block film (hereinafter, referred to as a BOX film) 304 is formed as a first oxide film on an inner surface of the concave portion 303 (see FIG. 5B). The BOx film 304 is, for example, a SiO film, a High-k film, or a laminated film thereof, and performs a function of preventing charge tunneling.

Next, a charge trap film (hereinafter, referred to as a CTN film) 306, which is CTN and $Si_xN_y$ film (where x and y are integers of 1 or more), is formed on an inner surface of the BOX film 304 (see FIG. 5C). The CTN film 306 performs a function of trapping charges.

Next, a tunnel oxide film (hereinafter, referred to as a TOx film) 308 is formed as a second oxide film on an inner surface of the CTN film 306 (see FIG. 5D). The TOx film 308 is, for example, a silicon oxynitride film (SiON film) and performs a function of tunneling charges.

Figure 5A:
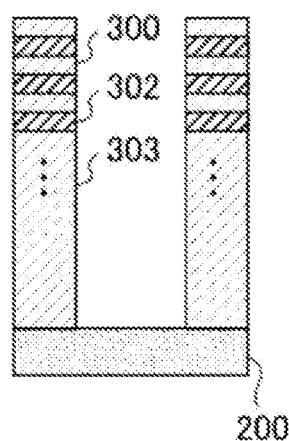
FIGS. 5A to 5I are views showing an example of a process of manufacturing a 3D NAND memory cell.
Figure 5B:
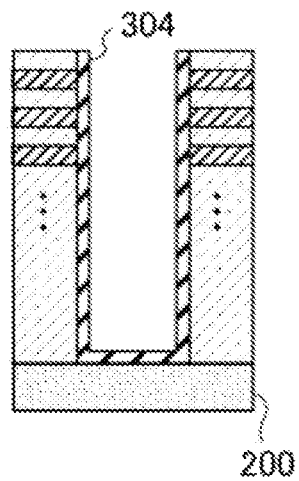
Figure 5C:
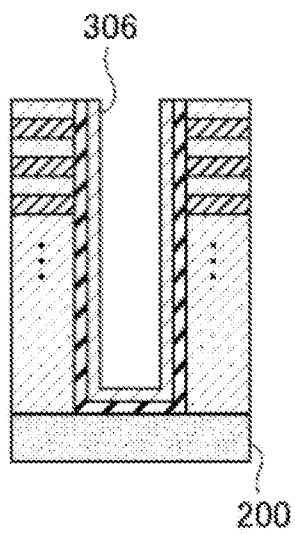
Figure 5D:
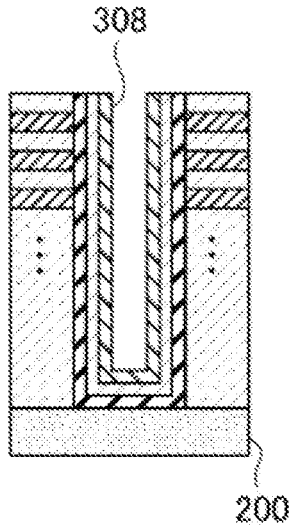
Figure 5E:
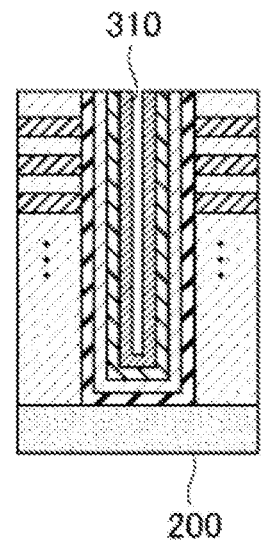

Next, a channel film 310 such as polysilicon (poly-Si) is formed on an inner surface of the TOx film 308 (FIG. 5E).

Figure 5F:
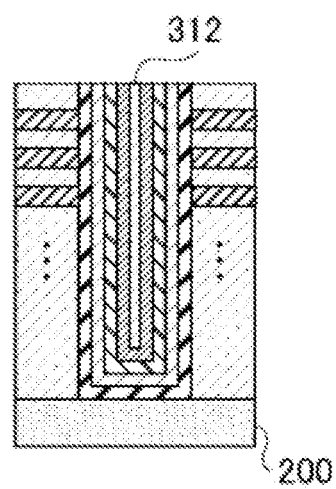

Next, a buried oxide film 312 is filled in the trench in the concave portion 303 on an inner surface of the channel film 310 (FIG. 5F).

Figure 5G:
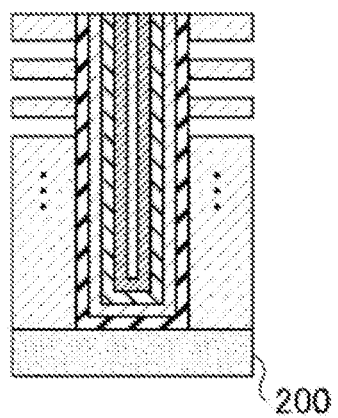

Next, the SiN films 302 laminated in FIG. 5A are etched (FIG. 5G).

Figure 5H:
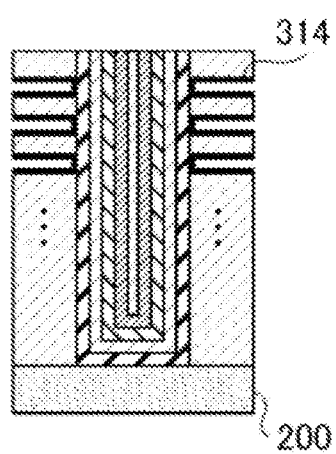

Next, a liner film 314 such as a metal-containing film is formed on the inner surface of the SiO films 300 from which the SiN films 302 were etched (FIG. 5H). The liner film 314 is, for example, an aluminum oxide (AlO) film or a titanium nitride (TiN) film.

Figure 5I:
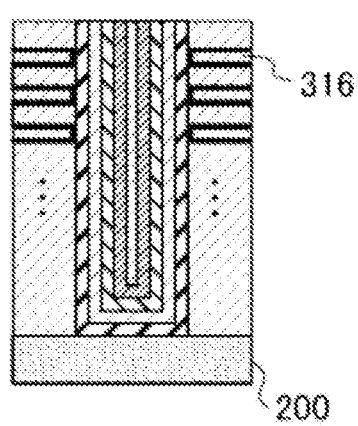
Figure 6:
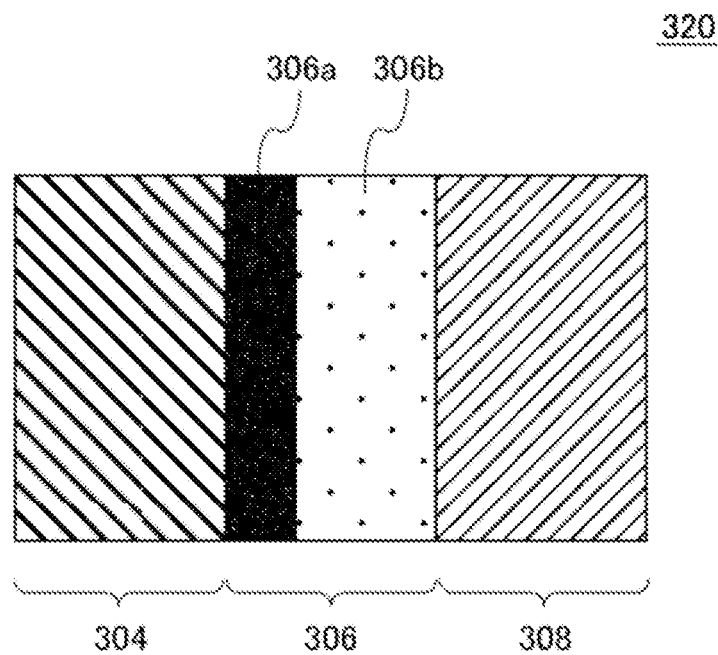
FIG. 6 is a view that explains a CTN formed by a substrate processing process suitably used in the embodiments of the present disclosure.

Then, the inside of the liner film 314 is filled with a metal-containing film to form a control gate 316 which is a word electrode (FIG. 5I).

As described above, the 3D NAND memory cell is formed of the BOX film 304, the CTN film 306, the TOx film 308, the channel film 310, and the control gate 316 in this order.

On the other hand, a planar NAND memory cell is formed of the channel film 310, the TOx film 308, the CTN film 306, the BOX film 304, and the control gate 316 in this order.

Here, the NAND memory cell stores data by accumulating charges. These charges are trapped in the CTN film 306 in an ONO film 320 including the TOx film 308, the CTN film 306, and the BOx film 304.

Here, it is desired that step coverage characteristics as well as charge retention characteristics (also referred to as charge trap characteristics) of the CTN film 306 be good. The charge retention characteristics is an ability of retaining charges. Further, the step coverage characteristics is a step coverage and is a relationship between a film thickness on an upper side surface and a film thickness on a lower side surface of the concave portion 303. As a difference between the upper side surface and the lower side surface of the concave portion 303 becomes smaller, the step coverage characteristics becomes better.

However, the SiN film that becomes the CTN film 306 changes in the charge retention characteristics and the step coverage characteristics depending on a type of gas used when the SiN film is formed, and therefore, there is a challenge in causing the charge retention characteristics and the step coverage characteristics to be compatible with each other. In view of the foregoing, the following substrate processing process is performed when the CTN film 306 is formed in the embodiments of the present disclosure.

(2) Substrate Processing Process

As a process of manufacturing a semiconductor device by using the above-described substrate processing apparatus, a substrate processing sequence example of forming a CTN film 306 on a wafer 200 as a substrate, that is, a film-forming sequence example (which is also an example of a method of processing a substrate and a method of manufacturing a semiconductor device.), will be described. In the following descriptions, operations of the respective components constituting the substrate processing apparatus are controlled by the controller 121.

Embodiments of the present disclosure include:
forming a first film containing a first element and a second element; and
forming a second film which is adjacent to the first film and contains the first element and the second element, the second film being different in characteristics from the first film.

The first film is formed by performing a cycle a predetermined number of times, the cycle including performing:
(a1) supplying a first precursor gas containing the first element; and
(b1) supplying a reaction gas (first reaction gas) containing the second element.

Further, the second film is formed by performing a cycle a predetermined number of times, the cycle including performing:
(a2) supplying a second precursor gas containing the first element and being higher in a thermal decomposition temperature than the first precursor gas; and
(b2) supplying a reaction gas (second reaction gas) containing the second element.

Specifically, the embodiments of the present disclosure include:
forming a first SiN film as the first film containing Si as the first element and N as the second element; and
forming a second SiN film as a second film which is adjacent to the first SiN film and contains Si and N, the second SiN film being different in characteristics from the first SiN film.

The first SiN film is formed by performing a cycle a predetermined number of times, the cycle including performing:
(a1) supplying a first precursor gas containing Si; and
(b1) supplying a reaction gas (first reaction gas) containing N.

Further, the second SiN film is formed by performing a cycle a predetermined number of times, the cycle including performing:
(a2) supplying a second precursor gas being higher in a thermal decomposition temperature than the first precursor gas; and
(b2) supplying a reaction gas (second reaction gas) containing N.

In the embodiments of the present disclosure, for the sake of convenience, the film-forming sequence may be denoted as follows. The same denotation may be used in other embodiments described below.

(First precursor gas→Reaction gas)×m+(Second precursor gas→Reaction gas)×n (m is an integer of 1 or more, specifically 2 or more, and n is an integer of 1 or more, specifically 2 or more)
⇒First SiN film+Second SiN film⇒CTN film When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

The boat 217 is charged with a plurality of wafers 200 (wafer charging). After that, as shown in FIG. 1, the boat 217 charged with the plurality of wafers 200 is lifted up by the boat elevator 115 to be loaded into the process chamber 201 (boat loading). In this state, the seal cap 219 seals the lower end of the reaction tube 203 via the O-ring 220. At this time, for example, as shown in FIG. 5B described above, the BOx film 304 is formed in a concave shape on the surface in the concave portion 303 on the wafer 200.

(Pressure Regulation and Temperature Regulation)

The interior of the process chamber 201, that is, a space where the wafers 200 are placed, is vacuum-exhausted (decompression-exhausted) by the vacuum pump 246 to reach a desired processing pressure (state of vacuum). In this operation, the internal pressure of the process chamber 201 is measured by the pressure sensor 245, and the APC valve 244 is feedback-controlled based on the measured pressure information. Further, the wafers 200 in the process chamber 201 are heated by the heater 207 until a desired processing temperature (film formation temperature) is reached. In this operation, a state of supplying electric power to the heater 207 is feedback-controlled based on the temperature information detected by the temperature sensor 263 such that a temperature distribution in the process chamber 201 becomes a desired temperature distribution. Further, the rotation of the wafers 200 by the rotator 267 is started. The operation of the vacuum pump 246 and the heating and rotation of the wafers 200 are continuously performed at least until the processing on the wafers 200 is completed. The processing temperature means the temperature of the wafers 200, and the processing pressure means the internal pressure of the process chamber 201. The same applies to the following description.

(Film-Forming Process)

Subsequently, the following steps are performed sequentially.

<First Film-Forming Step>
[Step a1]

In this step, a first precursor gas is supplied to the wafer 200 in the process chamber 201, that is, the BOx film 304 formed on the wafer 200. Specifically, the valve 243a is opened to allow the first precursor gas to flow through the gas supply pipe 232a. The flow rate of the first precursor gas is regulated by the MFC 241a, and the first precursor gas is supplied into the process chamber 201 via the nozzle 249a and is exhausted via the exhaust pipe 231. In this operation, the first precursor gas is supplied to the wafer 200. At the same time, the valves 243d and 243e are opened to allow a $N_2$ gas to flow through the gas supply pipes 232d and 232e. The flow rate of the $N_2$ gas is regulated by the MFCs 241d and 241e. The $N_2$ gas with the regulated flow rate is supplied into the process chamber 201, together with the first precursor gas, and is exhausted via the exhaust pipe 231.

Processing conditions in this step are exemplified as follows.

First precursor gas supply flow rate: 1 to 2,000 sccm, specifically 100 to 1,000 sccm $N_2$ gas supply flow rate: 100 to 20,000 sccm Each gas supply time: 0.5 to 60 seconds, specifically 1 to 30 seconds Processing temperature (temperature higher than the first temperature, specifically temperature higher than the first temperature and lower than the second temperature): 500 to 1,000 degrees C., specifically 600 to 800 degrees C., more specifically 650 to 750 degrees C.

Processing pressure: 1 to 2,666 Pa, specifically 10 to 1,333 Pa

In the present disclosure, notation of a numerical range such as "500 to 1,000 degrees C." means that a lower limit value and an upper limit value are included in the range. Therefor, "500 to 1,000 degrees C." means "equal to or higher than 500 degrees C. and equal to or lower than 1,000 degrees C." The same applies to other numerical ranges.

In the embodiments of the present disclosure, as pretreatment in this step, a pre-flow of supplying a reaction gas such as a $NH_3$ gas to the wafer 200 in advance is performed. By supplying the $NH_3$ gas to the wafer 200 in the pre-flow, adsorption sites by hydrogen (H) are formed on the surface of the wafer 200, such that Si atoms may be easily adsorbed (that is, reactivity with the Si atoms is high) in this step and step b1, which is described below. The procedure of the pre-flow may be performed, for example, in the same manner as in step b1 described below. The reaction gas supplied in the pre-flow step (pre-flow gas) may be the same as the reaction gas in step b1 and/or step b2 described below, but it may be different from that in step b1 and/or step b2.

Under the aforementioned conditions, most of the molecular structure of the first precursor gas is thermally decomposed, such that Si contains dangling bonds. As a result, Si containing the dangling bonds may react with the adsorption sites on the surface of the wafer 200 in step a1 to be adsorbed on the surface of the wafer 200. Further, Si atoms containing dangling bonds due to the thermal decomposition of the first precursor gas are bonded to each other to form Si—Si bonds. By causing the Si—Si bonds to react with the adsorption sites remaining on the surface of the wafer 200, it is possible to cause the Si—Si bonds to be contained on the BOX film 304 and form a layer in which Si is multi-deposited. That is, in this step, an amount (content ratio) of Si—Si bonds contained in the first film is made larger than an amount (content ratio) of Si—Si bonds contained in the second film which is described below. That is, the first film becomes a Si-rich film where Si is richer than that of the second film. This increases a trap level and improves the charge retention characteristics. That is, the trap level of the first film is larger than that of the second film. Cl separated from Si constitutes gaseous substance such as HCl or $Cl_2$, which is exhausted via the exhaust pipe 231.

Further, the thermal decomposition temperature of the first precursor gas may be lower than the thermal decomposition temperature of the second precursor gas, as described above, to make the amount of Si—Si bonds contained in the first film in this step larger than the amount of Si—Si bonds contained in the second film to be described below. In other words, the first precursor gas may be a gas that forms Si—Si bonds more easily than the second precursor gas under the same conditions. For example, Si—Si bonds may be contained in the molecules of the first precursor gas, or a composition ratio of Si to a halogen element such as Cl in the molecules of the first precursor gas is higher than that of the second precursor gas. In this way, in this step, the processing conditions such as the processing temperature in each step, the first precursor gas, and the second precursor gas are selected such that Si—Si bonds that react with the adsorption sites remaining on the surface of the wafer are formed more easily than in step a2 to be described below.

As a result, in this step, a Si-containing layer is formed as the first layer of the first film.

In a case where the processing temperature is lower than 500 degrees C., the first precursor gas is less likely to be thermally decomposed, which may make it difficult to form the first layer. By setting the processing temperature to 500 degrees C. or higher, it is possible to form the first layer on the wafer 200. By setting the processing temperature to 600 degrees C. or higher, the above-described effects may be reliably obtained. By setting the processing temperature to 650 degrees C. or higher, the above-described effects may be more reliably obtained.

In a case where the processing temperature exceeds 1,000 degrees C., the thermal decomposition of the first precursor gas becomes excessive, and deposition of Si that is not self-saturated tends to progress rapidly, making it difficult to form the first layer substantively uniformly in some cases. By setting the processing temperature to 1,000 degrees C. or lower, excessive thermal decomposition of the first precursor gas is suppressed, and deposition of Si that is not self-saturated is controlled such that the first layer may be formed substantively uniformly. By setting the processing temperature to 800 degrees C. or lower, the above-described effects may be reliably obtained. By setting the processing temperature to 750 degrees C. or lower, the above-described effects may be more reliably obtained.

After forming the first layer of the first film on the wafer 200, the valve 243a is closed to stop the supply of the first precursor gas into the process chamber 201. Then, the interior of the process chamber 201 is vacuum-exhausted to remove a gas and the like remaining in the process chamber 201 from the process chamber 201. In this operation, the valves 243d and 243e are left open to maintain the supply of the $N_2$ gas as an inert gas into the process chamber 201. The $N_2$ gas acts as a purge gas, whereby the effect of removing the gas and the like remaining in the process chamber 201 from the process chamber 201 may be enhanced.

A halosilane-based gas containing silicon (Si) as the first element and a halogen element may be used as the first precursor gas. Halosilane is silane containing a halogen group. The halogen group includes a chloro group, a fluoro group, a bromo group, an iodine group, and the like. That is, the halogen group contains halogen element such as chlorine (Cl), fluorine (F), bromine (Br), and iodine (I). For example, a precursor gas containing Si and Cl, that is, a chlorosilane-based gas, may be used as the halosilane-based gas. A chlorosilane-based gas containing two or more Si atoms contained in one molecule and containing Si—Si bonds, for example, a hexachlorodisilane ($Si_2Cl_6$, abbreviation: HCDS) gas, may be used as the first precursor gas. The $Si_2Cl_6$ gas acts as a Si source in a film-forming process which is described below. In the present disclosure, when the first precursor gas exists alone in the process chamber 201, a temperature at which the first precursor gas is thermally decomposed may be referred to as a first temperature. The first temperature when the $Si_2Cl_6$ gas is used as the first precursor gas is a predetermined temperature within a range of 500 degrees C. or higher. In addition to the $Si_2Cl_6$ gas, a gas containing at least one selected from the group of a silicon hydride-based gas such as a monosilane ($SiH_4$, abbreviation: MS) gas and an aminosilane-based gas such as a trisdimethylaminosilane ($Si[N(CH_3)_2]_3H$, abbreviation: 3DMAS) gas or a bisdiethylaminosilane ($SiH_2[N(C_2H_5)_2]_2$, abbreviation: BDEAS) gas may be used as the first precursor gas. One or more selected from the group of these gases may be used as the first precursor gas.

In addition to the $N_2$ gas, a rare gas such as, an Ar gas, a He gas, a Ne gas, or a Xe gas may be used as the inert gas. The same applies steps b1, a2, and b2 to be described later.

[Step b1]

In this step, a reaction gas containing N is supplied to the wafer 200 in the process chamber 201, that is, the first layer of the first film formed on the BOx film 304 formed on the wafer 200. Specifically, the valve 243b is opened to allow the reaction gas to flow through the gas supply pipe 232b. The flow rate of the reaction gas is controlled by the MFC 241b, and the reaction gas is supplied into the process chamber 201 via the nozzle 249b and is exhausted via the exhaust pipe 231. In this operation, the reaction gas is supplied to the wafer 200.

Processing conditions in this step are exemplified as follows.

Reaction gas supply flow rate: 100 to 10,000 sccm, specifically 1,000 to 5,000 sccm Reaction gas supply time: 1 to 120 seconds, specifically 10 to 60 seconds Processing pressure: 1 to 4,000 Pa, specifically 10 to 1,000 Pa Other processing conditions are the same as those in step a1. However, the temperature condition in step b1 may be the same as that in step a1 from the viewpoint of improving a productivity of the film-forming process, but it may be different from that in step a1.

Under the aforementioned conditions, at least a portion of the Si-containing layer, which is the first layer of the first film, may be nitrided. Cl contained in the first layer constitutes a gaseous substance such as HCl or $Cl_2$, which is exhausted via the exhaust pipe 231.

As a result, a SiN layer containing Si and N is formed as a second layer of the first film on the wafer 200. By setting the supply time of the first precursor gas in step a1 to be longer than the supply time of the reaction gas in step b1, a Si-rich first film may be formed.

After forming the second layer of the first film on the wafer 200, the valve 243b is closed to stop the supply of the reaction gas into the process chamber 201. Then, a gas and the like remaining in the process chamber 201 is removed from the process chamber 201 according to the same processing procedures and processing conditions as in the step of removing the residual gas in step a1 described above.

For example, a nitrogen (N)- and hydrogen (H)-containing gas, which is a nitriding gas (nitriding agent), may be used as the reaction gas. The N- and H-containing gas is both a N-containing gas and a H-containing gas. The N- and H-containing gas may contain N—H bonds. For example, a hydrogen nitride-based gas such as a $NH_3$ gas, a diazene ($N_2H_2$) gas, a hydrazine ($N_2H_4$) gas, or a $N_3H_8$ gas may be used as the reaction gas. One or more selected from the group of these gases may be used as the reaction gas. The reaction gas supplied in this step (first reaction gas) may be the same as the reaction gas in step b2 described below, but it may be different from that in step b2.

[Performing Predetermined Number of Times]

By performing a cycle a predetermined number of times (m time, where m is an integer of 1 or more, specifically 2 or more), the cycle including performing the above-described steps a1 and b1, for example, a first SiN film 306a containing Si and N with a predetermined composition ratio and a predetermined film thickness may be formed as the first film on the BOX film 304 of the wafer 200. Further, the above-described cycle may be performed a plurality of times. That is, with a thickness of a layer formed per cycle set to be smaller than a desired film thickness, the above-described cycle may be performed a plurality of times until the layer reaches the desired film thickness. Further, step a1 and step b1 may be performed alternately and non-simultaneously, or may be partially overlapped.

As a result, the first SiN film 306a is formed on the BOX film 304 of the wafer 200. The first SiN film 306a becomes a Si-rich film with good charge retention characteristics. That is, the first SiN film 306a becomes a film containing Si and N with the first charge retention characteristics and the first step coverage characteristics.

Subsequently (continuously), the next second film-forming step is performed.

<Second Film-Forming Step>

[Step a2]

Next, a second precursor gas is supplied to the wafer 200 in the process chamber 201, that is, the first film formed on the wafer 200. Specifically, the valve 243c is opened to allow the second precursor gas to flow through the gas supply pipe 232c. The flow rate of the second precursor gas is regulated by the MFC 241c, and the second precursor gas is supplied into the process chamber 201 via the nozzle 249a and is exhausted via the exhaust pipe 231. In this operation, the second precursor gas is supplied to the first SiN film 306a formed on the wafer 200. At the same time, the valves 243d and 243e are opened to allow a $N_2$ gas to flow through the gas supply pipes 232d and 232e. The flow rate of the $N_2$ gas is regulated by the MFCs 241d and 241e. The $N_2$ gas with the regulated flow rate is supplied into the process chamber 201, together with the second precursor gas, and is exhausted via the exhaust pipe 231.

The processing conditions in this step are exemplified as follows.

Second precursor gas supply flow rate: 1 to 2,000 sccm, specifically 100 to 1,000 sccm Second precursor gas supply time: 10 to 300 seconds, specifically 30 to 120 seconds Processing temperature (temperature lower than the second temperature, specifically temperature lower than the second temperature and higher than the first temperature): 400 to 800 degrees C., specifically 500 to 800 degrees C., more specifically 600 to 750 degrees C.

Other processing conditions are the same as those in step a1.

Under the aforementioned conditions, a portion of Si—Cl bonds in the second precursor gas may be cut, and Si containing dangling bonds may be adsorbed on the adsorption sites of the surface of the wafer 200. Further, under the aforementioned conditions, uncut Si—Cl bonds in the second precursor gas may be maintained as they are. For example, in a state in which Cl is bonded to each of three bonding hands among four bonding hands of Si constituting the second precursor gas, Si containing dangling bonds may be adsorbed on the adsorption sites of the surface of the wafer 200. Further, since Cl retained without being cut off from Si adsorbed on the surface of the wafer 200 inhibits such Si from being bonded with other Si containing dangling bonds, multiple deposition of Si on the wafer 200 may be avoided. Cl separated from Si constitutes a gaseous substance such as HCl or $Cl_2$ and is exhausted via the exhaust pipe 231. When an adsorption reaction of Si progresses and no adsorption sites remain on the surface of the wafer 200, the adsorption reaction is saturated. In this step, the supply of the second precursor gas may be stopped before the adsorption reaction is saturated, to complete this step in a state where the adsorption sites remain.

As a result, a layer containing Si and Cl with substantively a uniform thickness of less than one atomic layer, that is, a Si-containing layer containing Cl, is formed as the first layer of the second film on the wafer 200, that is, on the first film of the wafer 200. Here, a layer with a thickness of less than one atomic layer means a discontinuously formed atomic layer, and a layer with a thickness of one atomic layer means a continuously formed atomic layer. Further, the fact that the layer with a thickness of less than one atomic layer is substantively uniform means that atoms are adsorbed on the surface of the wafer 200 with substantively a uniform density. Since the first layer of the second film is formed on the wafer 200 with substantively a uniform thickness, the step coverage characteristics and the wafer in-plane film thickness uniformity are excellent.

In a case where the processing temperature is less than 400 degrees C., it may be difficult for Si to be adsorbed on the wafer 200, making it difficult to form the first layer. By setting the processing temperature to 400 degrees C. or higher, it is possible to form the first layer on the wafer 200. By setting the processing temperature to 500 degrees C. or higher, the above-described effects may be reliably obtained. By setting the processing temperature to 600 degrees C. or higher, the above-described effects may be more reliably obtained.

In a case where the processing temperature exceeds 800 degrees C., it is difficult to maintain uncut Si—Cl bonds in the second precursor gas, and a thermal decomposition rate of the second precursor gas increases. As a result, Si may be multi-deposited on the wafer 200, such that it may be difficult to form the Si-containing layer with substantively a uniform thickness of less than one atomic layer, as the first layer. By setting the processing temperature to 800 degrees C. or lower, it is possible to form the Si-containing layer with substantively a uniform thickness of less than one atomic layer, as the first layer. By setting the processing temperature to 750 degrees C. or lower, the above-described effects may be reliably obtained.

After forming the first layer of the second film on the first SiN film 306a of the wafer 200, the valve 243c is closed to stop the supply of the second precursor gas into the process chamber 201. Then, a gas and the like remaining in the process chamber 201 is removed from the process chamber 201 according to the same processing procedure and processing conditions as in the step of removing the residual gas in step a1 described above.

A halosilane-based gas containing the first element and being higher in a thermal decomposition temperature than the first precursor gas may be used as the second precursor gas. For example, the second precursor gas is a halosilane-based gas containing Si as the first element and a halogen element. The second precursor gas refers to a gaseous precursor, for example, a gas obtained by vaporizing a precursor which remains in a liquid state at room temperature and atmospheric pressure, or a precursor which remains in a gas state at room temperature and atmospheric pressure. A chlorosilane-based gas containing one Si atom contained in one molecule, such as a tetrachlorosilane ($SiCl_4$) gas, may be used as the second precursor gas. The $SiCl_4$ gas acts as a Si source in the film-forming process which is described below. In the present disclosure, when the second precursor gas exists alone in the process chamber 201, a temperature at which the second precursor gas is thermally decomposed may be referred to as a second temperature. The second temperature when the $SiCl_4$ gas is used as the second precursor gas is a predetermined temperature within a range of 800 degrees C. or higher. In addition to the $SiCl_4$ gas, a halosilane precursor gas such as a dichlorosilane ($SiH_2Cl_2$, abbreviation: DCS) gas or a trichlorosilane ($SiHCl_3$, abbreviation: TCS) gas may be used as the second precursor gas. One or more selected from the group of these gases may be used as the second precursor gas.

[Step b2]

In this step, a reaction gas is supplied to the first layer of the second film formed on the wafer 200 in the process chamber 201, for example, on the first SiN film 306a. Specifically, the reaction gas is supplied to the first layer of the second film formed on the first SiN film 306a according to the same processing procedure and processing conditions as in the step of supplying the reaction gas in step b1 described above. As described above, the reaction gas supplied in this step (second reaction gas) may be the same as the reaction gas in step b1, but it may be different from that in step b1.

After forming a second layer of the second film on the wafer 200, the valve 243b is closed to stop the supply of the reaction gas into the process chamber 201. Then, a gas and the like remaining in the process chamber 201 is removed from the process chamber 201 according to the same processing procedure and processing conditions as in the step of removing the residual gas in step a1 described above.

[Performing Predetermined Number of Times]

By performing a cycle a predetermined number of times (n time, where n is an integer of 1 or more), the cycle including performing the above-described steps a2 and b2, for example, a second SiN film 306b with a predetermined composition ratio and a predetermined film thickness, which is adjacent to the first SiN film 306a as the first film, may be formed as the second film on the wafer 200. The above-described cycle may be performed a plurality of times. That is, with the thickness of a SiN layer formed per cycle set to be thinner than a desired film thickness, the above-described cycle may be performed a plurality of times until the thickness of the SiN layer reaches the desired film thickness.

As a result, the second SiN film 306b is formed on the first SiN film 306a. The second SiN film 306b is uniformly formed to become a film with good step coverage. That is, the second SiN film 306b becomes a film containing Si and N with second charge retention characteristics and the second step coverage characteristics. That is, the second SiN film 306b is different in characteristics from the first SiN film 306a.

That is, the first SiN film 306a and the second SiN film 306b are different in characteristics from each other due to different precursor gases. More specifically, the first SiN film 306a and the second SiN film 306b are different in charge retention characteristics and step coverage characteristics from each other due to a difference in the thermal decomposition temperature.

The first charge retention characteristics of the first SiN film 306a are superior to the second charge retention characteristics of the second SiN film 306b. For example, the first charge retention characteristics of the first SiN film 306a are twice or more superior to the second charge retention characteristics of the second SiN film 306b. Specifically, the first charge retention characteristics of the first SiN film 306a are ten times or more superior to the second charge retention characteristics of the second SiN film 306b. More specifically, the first charge retention characteristics of the first SiN film 306a are fifteen times or more superior to the second charge retention characteristics of the second SiN film 306b. Further, the second step coverage characteristics of the second SiN film 306b are superior to the first step coverage characteristics of the first SiN film 306a. For example, according to the embodiments of the present disclosure, the second SiN film 306b may obtain a step coverage of at least 70% (for example, since a film thickness at a lower side surface of the second SiN film 306b formed in a groove is greater than a film thickness at an upper side surface of the second SiN film 306b, a film thickness ratio of the film thickness at the upper side surface to the film thickness at the lower side surface may be 70%). Further, for example, according to any one of the above-described methods in the embodiments of the present embodiment, the second SiN film 306b may obtain a step coverage of 80% or more. Further, for example, according to any one of the above-described methods in the embodiments of the present embodiment, the second SiN film 306b may also obtain a step coverage of 85% or more. Furthermore, for example, according to any one of the above-described methods in the embodiments of the present embodiment, the second SiN film 306b may obtain a step coverage of 90% or more. The first SiN film 306a may obtain a similar step coverage, but the step coverage of the second SiN film 306b is superior to that of the first SiN film 306a. With such a second SiN film 306b, it is possible to form a uniform and conformal film over the entire region of the concave portion formed on the surface of the wafer 200 as appropriate.

That is, the first SiN film 306a arranged near an interface of the BOX film 304 becomes a film with the first charge retention characteristics superior to the second charge retention characteristics of the second SiN film 306b. Further, the second SiN film 306b arranged near an interface of the TOx film 308 becomes a film with the second step coverage characteristics superior to the first step coverage characteristics of the first SiN film 306a. In other words, the CTN film 306 is constituted by a laminated film (also referred to as a multilayer film) including the first SiN film 306a with excellent charge retention characteristics and the second SiN film 306b with excellent step coverage characteristics.

Here, in the NAND memory cell, electric charges are charged on the CTN film 306 near the interface of the BOX film 304 (near the control gate 316). Therefore, the charge retention characteristics of the CTN film 306 near the interface of the BOX film 304 matter. The CTN film 306 in the embodiments of the present disclosure is configured such that the first SiN film 306a with excellent charge retention characteristics is arranged near the interface of the BOX film 304 and the second SiN film 306b with excellent step coverage characteristics is arranged near the interface of the TOx film 308. Therefore, the CTN film 306 is a film with good charge retention characteristics and good step coverage characteristics as a whole, making it possible to achieve both an effect of improving the charge retention characteristics of the CTN film 306 and an effect of improving the step coverage characteristics of the CTN film 306.

The film thickness of the first SiN film 306a may be smaller than the film thickness of the second SiN film 306b. Even when the first SiN film 306a is formed to be thinner than the second SiN film 306b, it is possible to improve the charge retention characteristics. The step coverage characteristics of the CTN film 306 may be improved by forming the second SiN film 306b to be thicker than the first SiN film 306a.

Specifically, 1 nm to 3 nm of the CTN film 306 near the BOx film 304, for example, about 2 nm of the CTN film 306, is used as the first SiN film 306a with good charge retention characteristics, and 3 nm to 7 nm of the CTN film 306 near the TOx film 308, for example, about 6 nm of the CTN film 306 near the TOx film 308, is used as the second SiN film 306b with good step coverage characteristics. Although a total film thickness of the first SiN film 306a and the second SiN film 306b may be appropriately determined, it is exemplified herein as 8 nm.

In a case where the film thickness of the first SiN film 306a is less than 1 nm, it may not be possible to retain sufficient charges. By setting the film thickness of the first SiN film 306a to 1 nm or more, it is possible to retain sufficient charges. Further, in a case where the film thickness of the first SiN film 306a exceeds 3 nm, it may be possible to retain sufficient charges, but the second SiN film 306b may not be thickened, which may make it difficult to secure sufficient step coverage characteristics. By setting the film thickness of the first SiN film 306a to 3 nm or less, it is possible to secure sufficient step coverage characteristics while retaining charges.

Further, in a case where the film thickness of the second SiN film 306b is less than 3 nm, sufficient step coverage characteristics may not be obtained. By setting the film thickness of the second SiN film 306b to 3 nm or more, sufficient step coverage characteristics may be obtained. Further, in a case where the film thickness of the second SiN film 306b exceeds 7 nm, it may be possible to obtain sufficient step coverage characteristics, but the first SiN film 306a may not be thickened, which may make it difficult to retain sufficient charges. By setting the film thickness of the second SiN film 306b to 7 nm or less, it is possible to achieve sufficient charge retention while securing step coverage characteristics.

As described above, in the first film-forming step, by performing a cycle a predetermined number of times, the cycle including performing step a1 of supplying the first precursor gas and step b1 of supplying the reaction gas in this order, it is possible to achieve good charge retention characteristics of the SiN film formed on the wafer 200. On the other hand, in the first film-forming step, since the thickness of the Si-containing layer formed per cycle is likely to be non-uniform within the wafer plane, it may be difficult to improve the step coverage characteristics and the wafer in-plane film thickness uniformity of the SiN film formed on the wafer 200.

Further, in the second film-forming step, by performing a cycle a predetermined number of times, the cycle including performing step a2 of supplying the second precursor gas being higher in the thermal decomposition temperature than the first precursor gas and thus not being difficult to be thermally decomposed, and step b2 of supplying the reaction gas in this order, the thickness of the Si-containing layer formed per cycle is made uniform over the wafer plane, making it possible to achieve good step coverage characteristics and good wafer in-plane film thickness uniformity of the SiN film formed on the wafer 200. On the other hand, it may be difficult to improve the charge retention characteristics.

The CTN film 306 in the embodiments of the present disclosure is constituted by laminating the first SiN film 306a formed by performing a cycle a predetermined number of times, the cycle including performing the step a1 and the step b1 in this order and the second SiN film 306b formed by performing a cycle a predetermined number of times, the cycle including performing the step a2 and the step b2 in this order.

That is, in the present disclosure, by forming the CTN film 306 as the laminated film in which the first SiN film 306a with excellent charge retention characteristics and the second SiN film 306b with excellent step coverage characteristics are laminated, it is possible to form a film with excellent charge retention characteristics and excellent step coverage characteristics.

(After-Purge and Returning to Atmospheric Pressure)

After the above-described film-forming process is completed, a $N_2$ gas as an inert gas is supplied into the process chamber 201 from each of the gas supply pipes 232d and 232e and is exhausted via the exhaust pipe 231. Thus, the interior of the process chamber 201 is purged to remove a gas and reaction by-products remaining in the process chamber 201 from the process chamber 201 (after-purge). After that, the internal atmosphere of the process chamber 201 is substituted with the inert gas (inert gas substitution) and the internal pressure of the process chamber 201 is returned to the atmospheric pressure (returning to atmospheric pressure).

(Boat Unloading and Wafer Discharging)

After that, the seal cap 219 is moved down by the boat elevator 115 to open the lower end of the reaction tube 203. Then, the processed wafers 200 supported by the boat 217 are unloaded from the lower end of the reaction tube 203 to the outside of the reaction tube 203 (boat unloading). After that, the processed wafers 200 are discharged from the boat 217 (wafer discharging).

(3) Effects of the Embodiments of the Present Disclosure

According to the embodiments of the present disclosure, one or more effects set forth below may be achieved.

(a) In the embodiments of the present disclosure, since the first film formed by supplying the first precursor gas and the second film formed by supplying the second precursor gas are laminated, it is possible to achieve both an effect of enhancing the charge retention characteristics of the CTN film formed on the wafer 200 and an effect of improving the step coverage characteristics and the wafer in-plane film thickness uniformity.

In an example of the embodiments of the present disclosure, in the first film-forming step, when the $Si_2Cl_6$ gas, which is lower in a thermal decomposition temperature and thus easier to be thermally decomposed than the $SiCl_4$ gas as the second precursor gas, is supplied as the first precursor gas to the wafer 200, the Si-containing layer containing Si—Si bonds with a thickness exceeding one atomic layer is formed on the wafer 200. This results in a Si-rich film in which Si is richer than that when the $SiCl_4$ gas is used, such that the trap level increases, making it possible to improve the charge retention characteristics.

Further, in an example of the embodiments of the present disclosure, when the $Si_2Cl_6$ gas is used as the first precursor gas, the thickness of the Si-containing layer formed per cycle is greater than that when the $SiCl_4$ gas is used as the second precursor gas, and therefore it is possible to improve a deposition rate of the SiN film formed on the wafer 200.

Further, in an example of the embodiments of the present disclosure, in the second film-forming step, when the $SiCl_4$ gas, which is higher in a thermal decomposition temperature than the $Si_2Cl_6$ gas as the first precursor gas and is difficult to be thermally decomposed, is supplied as the second precursor gas, the Si-containing layer with a substantively uniform thickness of less than one atomic layer is formed on the wafer 200. Therefore, since the thickness of the Si-containing layer formed per cycle is uniform over the wafer plane, it is possible to achieve good step coverage characteristics and good wafer in-plane film thickness uniformity of the SiN film formed on the wafer 200.

In the embodiments of the present disclosure, both the first film-forming step and the second film-forming step are performed, and therefore it is possible to achieve both effects obtained from the respective steps.

(b) In an example of the embodiments of the present disclosure, the processing temperature in the step a1 is set to be higher than the thermal decomposition temperature (the first temperature) of the $Si_2Cl_6$ gas and the processing temperature in the step a2 is set to be higher than the thermal decomposition temperature (the second temperature) of the $SiCl_4$ gas, the above-described effects may be reliably obtained.

In the step a1, since the processing temperature is set to a temperature higher than the first temperature, appropriate thermal decomposition of the $Si_2Cl_6$ gas may be maintained, making it possible to improve a deposition rate of the SiN film finally formed on the wafer 200. Further, it is possible to control the composition ratio of the SiN film to be Si-richer. Therefore, it is possible to perform control the charge retention characteristics to be enhanced.

Further, in an example of the embodiments of the present disclosure, in step a2, since the processing temperature is set to a temperature lower than the second temperature, the thermal decomposition of the $SiCl_4$ gas may be suppressed, making it possible to improve the step coverage characteristics and the wafer in-plane film thickness uniformity of the SiN film finally formed on the wafer 200. Further, it is possible to control the composition ratio of the SiN film to approach that of $Si_3N_4$.

(c) The above-described effects may be similarly obtained even when using the above-described first precursor gas, second precursor gas, reaction gas, and inert gas. The above-described effects are remarkably obtained when the halosilane-based gas is used as the precursor gas. Further, the above-described effects are particularly remarkably obtained when the chlorosilane-based gas is used as the precursor gas.

(4) Other Embodiments of the Present Disclosure

The embodiments of the present disclosure are specifically described above. However, the present disclosure is not limited to the above-described embodiments, and may be modified in various ways without departing from the gist of the present disclosure.

For example, after performing the above-described first film-forming step, the following second film-forming step may be performed instead of the above-described second film-forming step. That is, on the above-described first film, a third SiN film may be formed as the second film with characteristics different from those of the first film.

The third SiN film is formed by performing a cycle a predetermined number of times, the cycle including performing:

(a3) supplying a second precursor gas containing Si and being higher in a thermal decomposition temperature than the first precursor gas;

(b3) supplying the first precursor gas;

(c3) supplying a reaction gas (third reaction gas) containing N.

Further, the respective steps may be performed non-simultaneously, and may be performed so that a portion of an adjacent step may overlap.

That is, a CTN film (SiN film) may be formed on the wafer 200 according to a film-forming sequence described below.

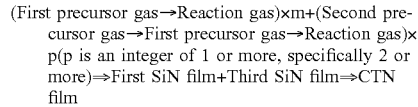
(First precursor gas→Reaction gas)×m+(Second precursor gas→First precursor gas→Reaction gas)× p(p is an integer of 1 or more, specifically 2 or more)⇒First SiN film+Third SiN film⇒CTN film That is, after performing the above-described first film-forming step, the second film-forming step may be performed subsequently (continuously).

<Second Film-Forming Step>

The following steps a3 to c3 are performed.

[Step a3]

A second precursor gas is supplied to the wafer 200 in the process chamber 201, that is, the first film formed on the wafer 200, according to the same processing procedure and processing conditions as in the above-described step a2. That is, the second precursor gas is supplied to the first SiN film 306a on the wafer 200.

Under the aforementioned conditions, a portion of Si—Cl bonds in the second precursor gas may be cut, and Si containing dangling bonds may be adsorbed on the adsorption sites of the surface of the wafer 200. Further, under the aforementioned conditions, uncut Si—Cl bonds in the second precursor gas may be maintained as they are. For example, in a state in which Cl is bonded to each of three bonding hands among four bonding hands of Si constituting the second precursor gas, Si containing dangling bonds may be adsorbed on the adsorption sites of the surface of the wafer 200. Further, since Cl retained without being cut off from Si adsorbed on the surface of the wafer 200 inhibits this Si from being bonded with other Si containing dangling bonds, multiple deposition of Si on the wafer 200 may be avoided. Cl separated from Si constitutes gaseous substance such as HCl or $Cl_2$ and is exhausted via the exhaust pipe 231. When an adsorption reaction of Si progresses and no adsorption sites remain on the surface of the wafer 200, the adsorption reaction is saturated. In this step, the supply of the second precursor gas may be stopped before the adsorption reaction is saturated, to complete this step in a state where the adsorption sites remain.

As a result, a layer containing Si and Cl with a substantively uniform thickness of less than one atomic layer, that is, a Si-containing layer containing Cl, is formed as the first layer on the first SiN film 306a of the wafer 200. Since the first layer is formed on the wafer 200 with the substantively uniform thickness, the step coverage characteristics and the wafer in-plane film thickness uniformity are excellent.

After forming the first layer, the valve 243a is closed to stop the supply of the second precursor gas into the process chamber 201. Then, the interior of the process chamber 201 is vacuum-exhausted to remove a gas and the like remaining in the process chamber 201 from the process chamber 201. In this operation, the valves 243d and 243e are left open to maintain the supply of the $N_2$ gas as the inert gas into the process chamber 201. The $N_2$ gas acts as the purge gas, whereby an effect of removing the gas and the like remaining in the process chamber 201 from the process chamber 201 may be enhanced.

[Step b3]

A first precursor gas is supplied to the wafer 200 in the process chamber 201, that is, the first layer formed on the first film, according to the same processing procedure and processing conditions as in the above-described step a1. That is, the first precursor gas is supplied to the first layer on the first SiN film 306a.

In this step, most of the molecular structure of the first precursor gas is thermally decomposed, whereby Si containing dangling bonds may react with adsorption sites on the surface of the wafer 200, which are left without forming the first layer in step a3, to be adsorbed on the surface of the wafer 200. On the other hand, since there is no adsorption site in a portion where the first layer is formed, adsorption of Si on the first layer is suppressed. As a result, in this step, the Si-containing layer as the second layer is formed with a substantively uniform thickness on the basis of the first layer formed with the substantively uniform thickness. Further, Si atoms containing dangling bonds due to the thermal decomposition of the first precursor gas are bonded to each other to form Si—Si bonds. By causing these Si—Si bonds to react with the adsorption sites remaining on the surface of the wafer 200, the second layer contains the Si—Si bonds, making it possible to form a layer in which Si is multi-deposited. That is, in this step, an amount (content ratio) of Si—Si bonds contained in the second layer is made larger than an amount (content ratio) of Si—Si bonds contained in the first layer. Cl separated from Si constitutes gaseous substance such as HCl or $Cl_2$, which is exhausted via the exhaust pipe 231.

Further, the thermal decomposition temperature of the first precursor gas may be lower than the thermal decomposition temperature of the second precursor gas, as described above, to make the amount of Si—Si bonds contained in the second layer in this step larger than the amount of Si—Si bonds contained in the first layer. In other words, the first precursor gas may be a gas that forms Si—Si bonds more easily than the second precursor gas under the same conditions. For example, Si—Si bonds are contained in the molecules of the first precursor gas, or a composition ratio of Si to a halogen element such as Cl in the molecules of the first precursor gas is higher than that of the second precursor gas. As such, in this step, the processing conditions such as the processing temperature in each step, the first precursor gas, and the second precursor gas are selected such that Si—Si bonds that react with the adsorption sites remaining on the wafer surface are formed more easily than in step a3.

As a result, in this step, the Si-containing layer with a substantively uniform thickness exceeding the thickness of the first layer is formed as the second layer of the second film. From the viewpoint of improving the deposition rate and the like, in the embodiments of the present disclosure, particularly, the Si-containing layer with a substantively uniform thickness exceeding one atomic layer is formed as the second layer. In the present disclosure, the second layer means the Si-containing layer on the wafer 200 formed by performing steps a3 and b3 once respectively.

Further, the temperature conditions in steps a3 and b3 may be substantively the same. Thus, since the temperature of the wafer 200, that is, the internal temperature of the process chamber 201 (the set temperature of the heater 207) may not change between steps a3 and b3, waiting time may not be set between steps until the temperature of the wafer 200 is stabilized, thereby improving a throughput of substrate processing. Therefore, in steps a3 and b3, the temperature of the wafer 200 may be set to a predetermined temperature within a range of, for example, 500 to 800 degree C., specifically 600 to 800 degree C., more specifically 650 to 750 degree C. In the embodiments of the present disclosure, when the temperature conditions in steps a3 and b3 are substantively the same, the temperature conditions, the first precursor gas, and the second precursor gas are selected such that the thermal decomposition of the second precursor gas does not substantively occur (that is, is suppressed) in step a3 and the thermal decomposition of the first precursor gas occurs (that is, is promoted) in step b3.

After forming the second layer on the wafer 200, the valve 243c is closed to stop the supply of the first precursor gas into the process chamber 201. Then, a gas and the like remaining in the process chamber 201 is removed from the process chamber 201 according to the same processing procedure and processing conditions as in the step of removing the residual gas in step a3 described above.

[Step c3]

A NH$_3$ gas as a N-containing reaction gas is supplied to the wafer 200 in the process chamber 201, that is, a layer formed by laminating the first layer and the second layer formed on the wafer 200 according to the same processing procedure and processing conditions as in the above-described step b1.

As a result, a SiN layer containing Si and N is formed as a third layer of the second film on the first SiN film 306a of the wafer 200. After forming the third layer on the wafer 200, the valve 243b is closed to stop the supply of the reaction gas into the process chamber 201. Then, a gas and the like remaining in the process chamber 201 is removed from the process chamber 201 according to the same processing procedure and processing conditions as the step of removing the residual gas in step a3 above described.

[Performing Predetermined Number of Times]

By performing a cycle a predetermined number of times (p time, where p is an integer of 1 or more), the cycle including performing the above-described steps a3 to c3, a third SiN film 306c with a predetermined composition ratio and a predetermined film thickness, which is adjacent to the first SiN film 306a as the first film, may be formed as the second film on the wafer 200. The above cycle may be performed a plurality of times. That is, with a thickness of a SiN layer formed per cycle set to be smaller than a desired film thickness, the above-described cycle may be performed a plurality of times until the thickness of the SiN layer reaches the desired film thickness.

In the above-described embodiments of the present disclosure, in the second film-forming step, since both the step a3 of supplying the second precursor gas and the step b3 of supplying the first precursor gas are performed, in addition to the same effects as those of the above-described embodiments of the present disclosure, it is possible to further achieve both the effect of improving the step coverage characteristics and the wafer in-plane film thickness uniformity of the SiN film formed on the wafer 200 and the effect of increasing the deposition rate of this film.

Further, in the above-described embodiments of the present disclosure, in each cycle of the second film-forming step, by performing the step a3 before the step b3 and then performing step b3, it is possible to increase the deposition rate while sufficiently exhibiting the step coverage characteristics and the wafer in-plane film thickness uniformity of the third SiN film 306c finally formed on the wafer 200.

(5) Modifications

Figure 7:
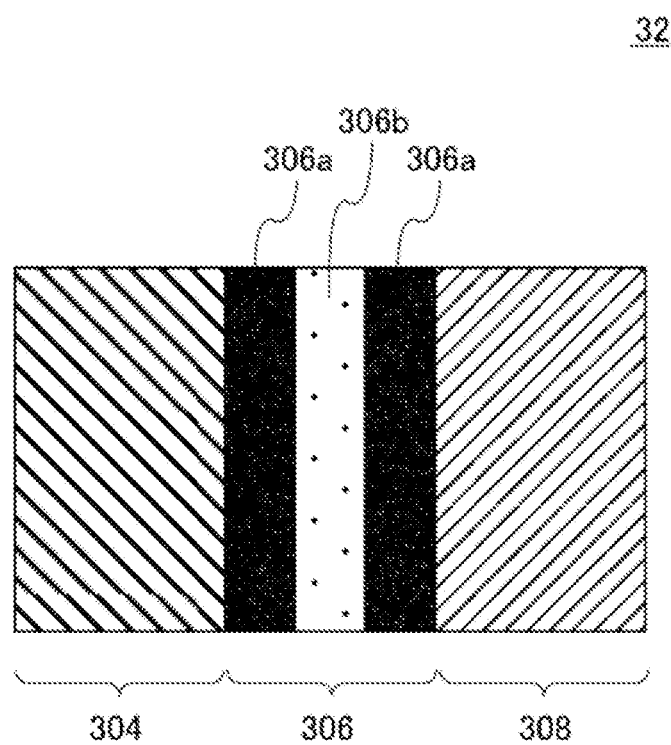
FIG. 7 is a view showing a modification of the CTN formed by a substrate processing process suitably used in the embodiments of the present disclosure.
Figure 8:
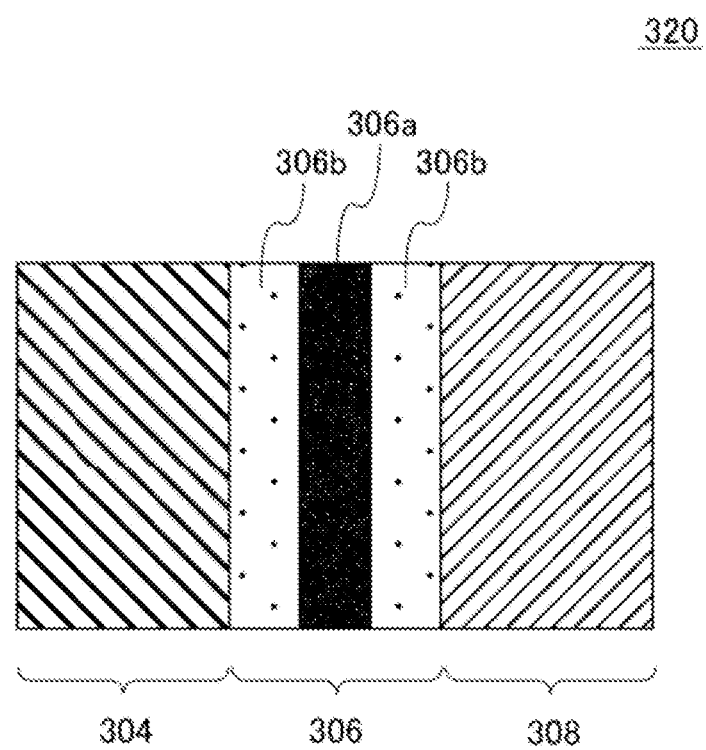
FIG. 8 is a view showing a modification of the CTN formed by the substrate processing process suitably used in the embodiments of the present disclosure.
Figure 9:
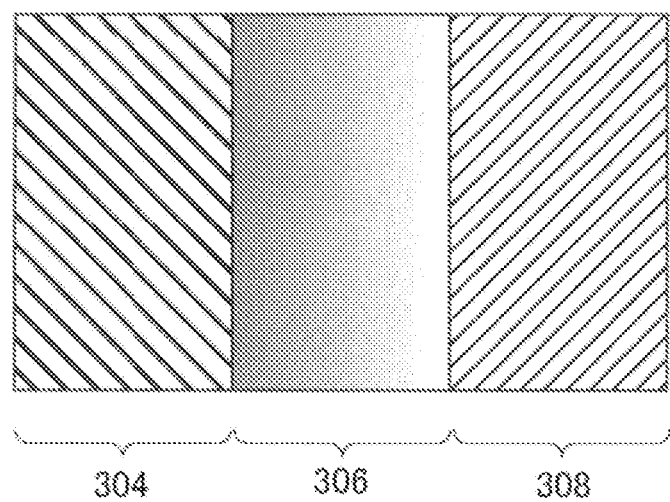
FIG. 9 is a view showing a modification of the CTN formed by a substrate processing process suitably used in the embodiments of the present disclosure.

The above-described substrate processing process may be modified as in the modifications shown below. FIGS. 7 to 9 are views showing modifications of a CTN film which is a charge trap film. Further, unless otherwise described, structures in the respective modifications are the same as those in the above-described embodiments of the present disclosure, and explanation thereof will be omitted.

(First Modification)

In this modification, as shown in FIG. 7, a CTN film 306 including three layers of a first SiN film 306a, a second SiN film 306b, and a first SiN film 306a in order from the side of a BOX film 304 is formed between the BOX film 304 and a TOx film 308. In other words, the first SiN films 306a with excellent charge retention characteristics are formed in contact with the BOX film 304 and the TOx film 308 respectively, and the second SiN film 306b with excellent step coverage is formed between the first SiN films 306a.

That is, in the above-described substrate processing process, the first SiN film 306a is formed by the above-described first film-forming step on the wafer 200 on which the BOx film 304 is formed, the second SiN film 306b is formed by the above-described second film-forming step, and then the first SiN film 306a with good charge retention characteristics is formed as a third film according to the same processing procedure and processing conditions as in the above-described first film-forming step.

That is, the first SiN film 306a is formed as the third film on the second SiN film 306b in the above-described embodiments of the present disclosure. As described above, the first SiN film 306a as the third film has the first charge retention characteristics superior to the second charge retention characteristics of the second SiN film 306b. The third film is not limited to the first SiN film 306a, and a film with third charge retention characteristics superior to the second charge retention characteristics of the second SiN film 306b may be used as the third film. That is, the film-forming sequence in this modification may be shown as follows.

(First precursor gas→Reaction gas)×m+(Second precursor gas→Reaction gas)×n+(First precursor gas→Reaction gas)×q(q is an integer of 1 or more, specifically 2 or more)⇒First SiN film (306a)+Second SiN film (306b)+First SiN film (306a)⇒CTN film(306)

As described above, the CTN film with good charge retention characteristics and good step coverage may be formed. Further, by forming the first SiN film 306a with excellent charge retention characteristics also near the TOx film 308, it is possible to easily take charges into/out of the TOx film 308 and store charges on the side of the TOx film 308 of the CTN film 306. Therefore, write/read speed in the memory cell is improved.

Further, even in a case where the above-described third SiN film 306c is used instead of the above-described second SiN film 306b, the same effects as the above-described embodiments of the present disclosure may be obtained.

(Second Modification)

In this modification, as shown in FIG. 8, a CTN film 306 including three layers of a second SiN film 306b, a first SiN film 306a, and a second SiN film 306b in order from the side of a BOx film 304 is formed between the BOX film 304 and a TOx film 308. In other words, the second SiN films 306b with excellent step coverage are formed in contact with the BOX film 304 and the TOx film 308 respectively, and the first SiN film 306a with excellent charge retention characteristics is formed between the second SiN films 306b. The first SiN film 306a with excellent charge retention characteristics may be close to the BOx film 304. For this reason, for example, when a film thickness of the CTN film 306 is 80 Å, a film thickness of the second SiN film 306b near the BOX film 304 is set to, for example, 1 nm, a film thickness of the first SiN film 306a is set to, for example, 4 nm, and a film thickness of the second SiN film 306b near the TOx film 308 is set to, for example, 3 nm.

That is, in the above-described substrate processing process, before performing the above-described first film-forming step on the wafer 200 on which the BOx film 304 is formed and before forming the first SiN film 306a, film-forming step is performed, the second SiN film 306b with good step coverage is formed as a third film according to the same processing procedure and processing conditions as in the above-described second film-forming step.

That is, the second SiN film 306b as the third film is formed before forming the first SiN film 306a as the first film. As described above, the second SiN film 306b shows the second step coverage characteristic superior to the first step coverage characteristic of the first SiN film 306a. The third film is not limited to the second SiN film 306b, and a film with third step coverage characteristics superior to the first step coverage characteristics of the first SiN film 306a may be used as the third film.

That is, the film-forming sequence in this modification may be shown as follows.

(Second precursor gas→Reaction gas)×r(r is an integer of 1 or more, specifically 2 or more)+(First precursor gas→Reaction gas)×m+(Second precursor gas→Reaction gas)xn=⇒Second SiN film (306b)+First SiN film (306a)+Second SiN film (306b)⇒CTN film (306)

As described above, the CTN film with good charge retention characteristics and good step coverage may be formed. Further, by forming the second SiN films 306b with excellent step coverage characteristics near the BOx film 304 and the TOx film 308 respectively, it is possible to uniformly form the CTN film 306 in a concave portion with a narrow horizontal hole.

Even in a case where the above-described third SiN film 306c is used instead of the above-described second SiN film 306b, the same effects as the above-described embodiments may be obtained.

(Third Modification)

In this modification, as shown in FIG. 9, a CTN film 306 is formed between a BOx film 304 and a TOx film 308 such that a portion of the CTN film 306 near an interface of the BOx film 304 is higher in Si content (Si-richer) than a portion of the CTN film 306 near an interface of the TOx film 308. That is, the portion of the CTN film 306 near the BOX film 304 is formed to improve the charge retention characteristics, and the portion of the CTN film 306 near the TOx film 308 is formed to improve the step coverage.

That is, a step of forming a SiN film containing Si and N is performed by performing a cycle a predetermined number of times, the cycle including performing the above-described step a1 and step b1 of the above-described substrate processing process on the BOX film 304 on the wafer 200. In this operation, while the cycle is performed the predetermined number of times, a supply amount of the first precursor gas in step a1 during each cycle is controlled to be smaller than a supply amount of the first precursor gas in step a1 during a previous cycle.

That is, while the cycle is performed the predetermined number of times, a supply time of the first precursor gas in step a1 per cycle during each cycle may be controlled to be shorter than a supply time of the first precursor gas in step a1 per cycle during a previous cycle. Further, while the cycle is performed the predetermined number of times, a supply flow rate of the first precursor gas in step a1 per cycle during each cycle may be controlled to be smaller than a supply flow rate of the first precursor gas in step a1 per cycle during a previous cycle.

As a result, in the CTN film 306, a SiN film is formed such that a portion of the SiN film near the BOX film 304 is Si-rich and is excellent in charge retention characteristics and a portion of the SiN film near the TOx film 308 is excellent in step coverage characteristics, making it possible to form the CTN film 306 with good charge retention characteristics and good step coverage.

Although various typical embodiments and modifications of the present disclosure are described above, the present disclosure is not limited to those embodiments and modifications, and the embodiments, the modifications, and the like may be used in proper combination. In those cases, the processing procedures and processing conditions may be, for example, the same as those in the above-described embodiments of the present disclosure.

According to the embodiments of the present disclosure, it is possible to achieve good charge retention characteristics and good step coverage characteristics.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    forming a first film containing a first element and a second element as a part of a charge trap film on an oxide film facing a control gate of a memory cell, the first film having first charge retention characteristics; and
    forming a second film which is adjacent to the first film and contains the first element and the second element as another part of the charge trap film on the first film, the second film having second charge retention characteristics,
    wherein the first charge retention characteristics are superior to the second charge retention characteristics,
    wherein the first film is formed by performing a first cycle a predetermined number of times, the first cycle including performing:
        (a1) supplying a first precursor gas containing the first element; and (b1) supplying a first reaction gas containing the second element, and wherein the second film is formed by performing a second cycle a predetermined number of times, the second cycle including performing:

(a2) supplying a second precursor gas containing the first element and being higher in a thermal decomposition temperature than the first precursor gas; and (b2) supplying a second reaction gas containing the second element.

2. The method of claim 1, wherein the first film has first step coverage characteristics, and the second film has second step coverage characteristics superior to the first step coverage characteristics.

3. The method of claim 1, further comprising forming a third film on the second film, wherein the third film has third charge retention characteristics superior to the second charge retention characteristics.

4. The method of claim 2, further comprising forming a third film before forming the first film, wherein the third film has third step coverage characteristics superior to the first step coverage characteristics.

5. The method of claim 1, wherein a film thickness of the first film is smaller than a film thickness of the second film.

6. The method of claim 1, wherein different halosilane-based gases are used as the first precursor gas and the second precursor gas respectively.

7. The method of claim 1, wherein a gas including at least one selected from a group of a silicon hydride-based gas and an aminosilane-based gas is used as the first precursor gas.

8. The method of claim 1, wherein a nitrogen-containing gas is used as the first reaction gas and the second reaction gas.

9. The method of claim 1, wherein the second cycle further includes performing (c2) supplying the first precursor gas.

10. A method of manufacturing a semiconductor device, comprising the method of claim 1.

11. The method of claim 10, wherein the second cycle further includes performing (c2) supplying the first precursor gas.

12. The method of claim 1, wherein the first reaction gas and the second reaction gas are the same gas.

13. A non-transitory computer-readable recording medium storing a program that causes, by a computer, a substrate processing apparatus to perform a process, the process comprising:

forming a first film containing a first element and a second element as a part of a charge trap film on an oxide film facing a control gate of a memory cell, the first film having first charge retention characteristics; and forming a second film which is adjacent to the first film and contains the first element and the second element as another part of the charge trap film on the first film, the second film having second charge retention characteristics, wherein the first charge retention characteristics are superior to the second charge retention characteristics, wherein one of the first film and the second film is formed by performing a first cycle a predetermined number of times, the first cycle including performing:

(a1) supplying a first precursor gas containing the first element; and (b1) supplying a first reaction gas containing the second element, and wherein the other of the first film and the second film is formed by performing a second cycle a predetermined number of times, the second cycle including performing:

(a2) supplying a second precursor gas containing the first element and being higher in a thermal decomposition temperature than the first precursor gas; and (b2) supplying a second reaction gas containing the second element.

14. The non-transitory computer-readable recording medium of claim 13, wherein the second cycle further includes performing (c2) supplying the first precursor gas.

15. A substrate processing apparatus comprising:

a first precursor gas supply system configured to supply a first precursor gas containing a first element to a substrate;

a second precursor gas supply system configured to supply a second precursor gas containing the first element and being higher in a thermal decomposition temperature than the first precursor gas to the substrate;

a reaction gas supply system configured to supply a reaction gas containing a second element different from the first element to the substrate; and a controller configured to be capable of controlling the first precursor gas supply system, the second precursor gas supply system, and the reaction gas supply system to perform a process in a process chamber, the process including:

forming a first film containing the first element and the second element as a part of a charge trap film on an oxide film facing a control gate of a memory cell, the first film having first charge retention characteristics; and forming a second film which is adjacent to the first film and contains the first element and the second element as another part of the charge trap film on the first film, the second film having second charge retention characteristics, wherein the first charge retention characteristics are superior to the second charge retention characteristics, wherein one of the first film and the second film is formed by performing a first cycle a predetermined number of times, the first cycle including performing:

(a1) supplying the first precursor gas; and (b1) supplying the reaction gas, and wherein the other of the first film and the second film is formed by performing a second cycle a predetermined number of times, the second cycle including performing:

(a2) supplying the second precursor gas; and (b2) supplying the reaction gas.

16. The substrate processing apparatus of claim 14, wherein the second cycle further includes performing (c2) supplying the first precursor gas.

17. The method of claim 1, wherein the first element is silicon, and wherein a content ratio of Si—Si bonds contained in the first film is larger than a content ratio of Si—Si bonds contained in the second film.

18. The method of claim 1, wherein a thickness of the first film is equal to or larger than 1 nm and equal to or smaller than 3 nm, and wherein a thickness of the second film is equal to or larger than 3 nm and equal to or smaller than 7 nm.

* * * * *